(12) United States Patent
Timm et al.

(10) Patent No.: US 9,804,200 B2
(45) Date of Patent: Oct. 31, 2017

(54) DIGITAL OSCILLOSCOPE COMPRISING MULTIPLE DATA ACQUISITION PATHWAYS

(75) Inventors: Daniel P. Timm, Colorado Springs, CO (US); Marshall Boss, Monument, CO (US); Matthew S. Holcomb, Colorado Springs, CO (US); Steven J. Pelelo, Colorado Springs, CO (US); Kristopher A. Larsen, Colorado Springs, CO (US); Michael R. Fender, Colorado Springs, CO (US)

(73) Assignee: Keysight Technologies, Inc., Santa Rosa, CA (US)

(\*) Notice: Subject to any disclaimer, the term of this patent is extended or adjusted under 35 U.S.C. 154(b) by 1187 days.

(21) Appl. No.: 13/397,338

(22) Filed: Feb. 15, 2012

(65) Prior Publication Data

US 2013/0207641 A1    Aug. 15, 2013

(51) Int. Cl.
| | |
|---|---|
| G01R 23/10 | (2006.01) |
| G01R 23/02 | (2006.01) |
| G01R 11/60 | (2006.01) |
| G01R 1/30 | (2006.01) |
| G01R 11/46 | (2006.01) |
| G01R 13/02 | (2006.01) |

(52) U.S. Cl.
CPC ...... G01R 13/0272 (2013.01); G01R 13/0236 (2013.01)

(58) Field of Classification Search
CPC .... G01R 13/02; G01R 13/20; G01R 13/0272; G01R 13/0236; H03M 1/12
See application file for complete search history.

(56) References Cited

U.S. PATENT DOCUMENTS

| | | | | |
|---|---|---|---|---|
| 4,320,390 | A | * | 3/1982 | Scott ............................ 341/156 |
| 4,851,833 | A | * | 7/1989 | Putrow et al. .................. 345/10 |
| 5,774,298 | A | * | 6/1998 | Cheung et al. ............ 360/77.08 |
| 5,898,420 | A | * | 4/1999 | Timm ........................ 345/440.1 |
| 6,064,193 | A | * | 5/2000 | Hansen et al. ................ 324/132 |
| 6,344,844 | B1 | * | 2/2002 | Timm et al. ............... 345/440.1 |
| 6,693,576 | B2 | * | 2/2004 | Azinger ........................ 341/155 |

(Continued)

FOREIGN PATENT DOCUMENTS

| | | |
|---|---|---|
| EP | 0507470 | 7/1992 |
| WO | WO2010025196 | 4/2010 |

OTHER PUBLICATIONS

"Scope of the Art: Digital Oscilloscopes from Rohde & Schwarz", http://www.rohde-schwarz.us/file__13956/N201_Scopes_e.pdf, accessed on Feb. 15, 2012.

(Continued)

*Primary Examiner* — Melissa Koval
*Assistant Examiner* — Courtney McDonnough

(57) ABSTRACT

A digital oscilloscope comprises a sampling unit configured to sample an input signal received from an oscilloscope probe to produce a first stream of digital samples, a first acquisition system configured to store and process the stream of digital samples to produce a first data set, a second acquisition system configured to store and process the first stream of digital samples independent of the first acquisition system to produce a second data set, and a display system configured to concurrently display the first data set in a first format and the second data set in a second format different from the first format.

25 Claims, 8 Drawing Sheets

(56) References Cited

U.S. PATENT DOCUMENTS

| | | | |
|---|---|---|---|
| 6,975,251 B2 * | 12/2005 | Pavicic | 341/50 |
| 7,338,443 B1 * | 3/2008 | Tucker | 600/300 |
| 2003/0034769 A1 * | 2/2003 | Lipscomb | G01R 15/125 324/99 D |
| 2004/0017224 A1 * | 1/2004 | Tumer et al. | 327/51 |
| 2004/0174818 A1 * | 9/2004 | Zocchi | 370/241 |
| 2006/0030352 A1 * | 2/2006 | Kiran et al. | 455/522 |
| 2007/0119269 A1 * | 5/2007 | Anjanappa et al. | 73/862.21 |
| 2011/0074390 A1 * | 3/2011 | Bartlett et al. | 324/76.41 |

OTHER PUBLICATIONS

Office Action dated Oct. 27, 2016 in Chinese Application No. 201310014619.3 (Unofficial/non-certified translation provided by foreign agent included).

* cited by examiner

Color 1

Color 2

DIGITAL OSCILLOSCOPE COMPRISING MULTIPLE DATA ACQUISITION PATHWAYS

BACKGROUND

A digital oscilloscope is a type of electronic test instrument used to observe electrical signals. A user of a digital oscilloscope typically applies an oscilloscope probe to a device under test (DUT) to measure a signal of interest. The oscilloscope probe then transmits the signal to an analog to digital converter (ADC), which converts the signal into a stream of digital samples. The stream of digital samples is then transmitted to a data acquisition system where it is processed and stored for subsequent display as a digital waveform.

The data acquisition system generally operates in periodic update cycles. For example, in a typical update cycle, it captures a predetermined number of digital samples from the stream, processes the captured samples (e.g., with trigger or timebase controls), and transmits them to a display system to be presented as a waveform. Between consecutive update cycles, there may be dead-time in which the data acquisition system does not store and capture portions of the stream of digital samples. In other words, the data acquisition system may ignore some of the available information. This can present problems, for instance, if the user is unable to observe glitches occurring at regular intervals that happen to fall within the dead-time.

In addition to ignoring some of the available information, conventional digital oscilloscopes may also be limited in the way they measure and display the sampled data. For example, most conventional oscilloscopes do not generate continuous measurements commonly found on digital voltmeters (DVMs), such as numerical displays of root mean squared (RMS) voltages or minimum and maximum voltages. Accordingly, a user desiring these types of measurements may be required to use both an oscilloscope and a DVM to measure the characteristics of a single DUT.

In view of these and other shortcomings of conventional digital oscilloscopes, there is a general need for digital oscilloscopes that can provide improved measurement and display capabilities without excessive cost or complexity.

SUMMARY

In a representative embodiment, a system comprises a sampling unit configured to sample an input signal received from an oscilloscope probe to produce a first stream of digital samples, a first acquisition system configured to store and process the first stream of digital samples to produce a first data set, a second acquisition system configured to store and process the first stream of digital samples independent of the first acquisition system to produce a second data set, and a display system configured to concurrently display the first data set in a first format and the second data set in a second for different from the first format.

In another representative embodiment, a system comprises a first sampling unit configured to sample an input signal received from an oscilloscope probe to produce a first stream of digital samples, an acquisition system configured to store and process the first stream of digital samples, a second sampling unit configured to downsample the first stream of digital samples to produce a second stream of digital samples, and a display system configured to display the first stream of digital samples as a voltage waveform and concurrently display the second stream of digital samples in a numerical format.

In yet another representative embodiment, a system comprises a first sampling unit configured to sample an input signal received from an oscilloscope probe to produce a first stream of digital samples, an acquisition system configured to store and process the first stream of digital samples, a second sampling unit configured to downsample the first stream of digital samples to produce a second stream of digital samples, a controller configured to determine minimum and maximum values of the second stream of digital samples over a window of time, and a display system configured to present a bar graph indicating the minimum and maximum values.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1:
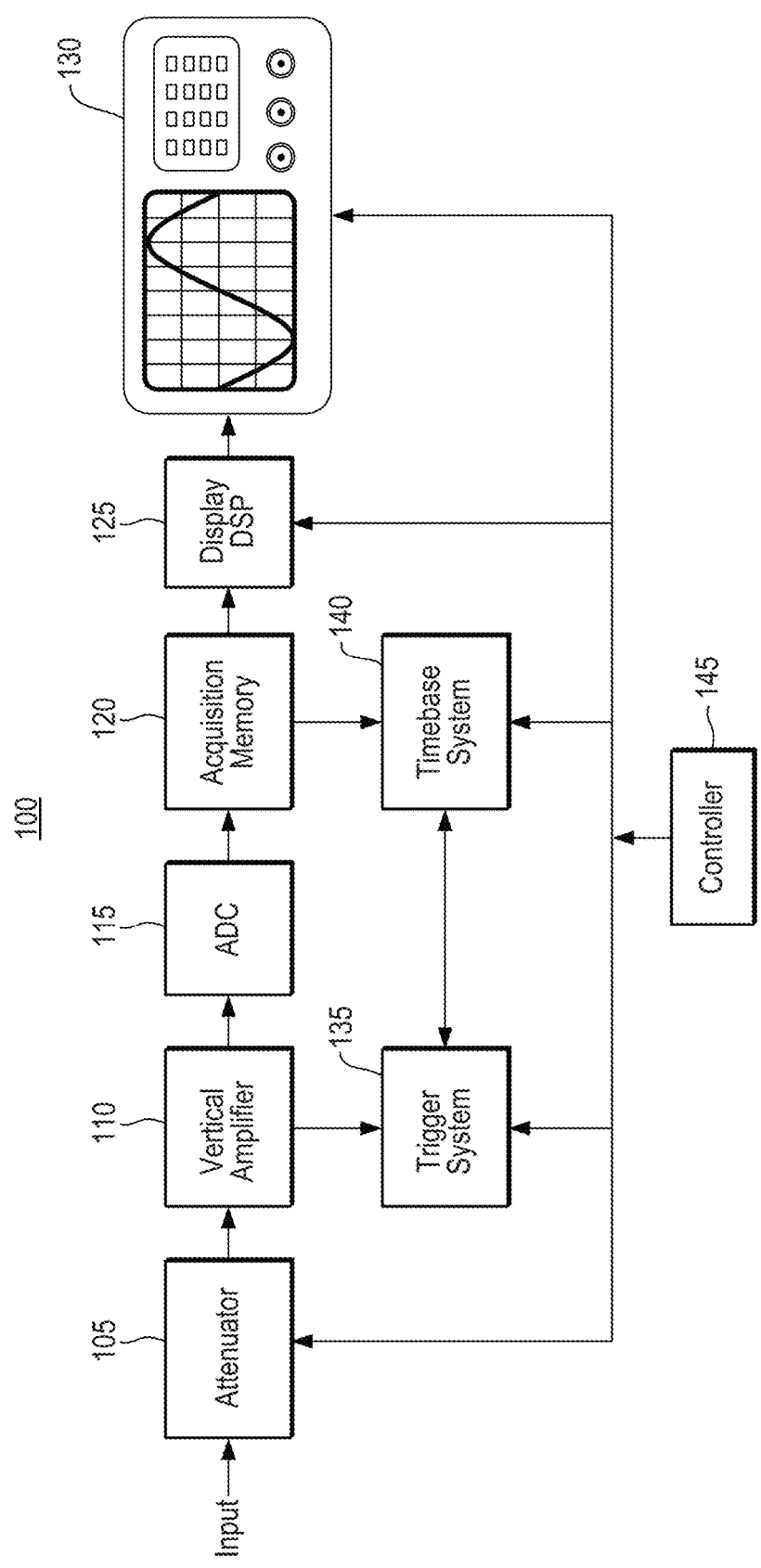
FIG. 1 is a diagram of a digital oscilloscope according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted no as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to digital oscilloscopes and related methods of operation. In certain embodiments, a digital oscilloscope comprises multiple data acquisition pathways capable of independently processing and displaying a stream of digital samples. These different pathways can be used, for instance, to display the digital samples in a waveform format through one pathway and to concurrently display them in a numerical format through another pathway.

In one embodiment, a digital oscilloscope processes a stream of digital samples using two independent data acquisition systems to produce two data sets. These data sets are then displayed in two different formats on an oscilloscope display. The first format can be, for instance, a triggered waveform. The second format can be, for instance, a numerical format or a bar graph.

In some embodiments, the two data acquisition systems comprise a conventional oscilloscope processing block and a low-speed sampling circuit. The oscilloscope processing block can comprise, for example, trigger and timebase controls, acquisition memory, etc., for generating a triggered waveform. The low-speed sampling circuit can be formed by a combination of a gated accumulator and a controller such as a field programmable gate array (FPGA). The low speed sampling circuit can run continuously and independent of the oscilloscope processing block so that low frequency measurements are available even when the oscilloscope processing block is not acquiring data. For example, if oscilloscope data acquisition is stopped or a channel is turned off, the low frequency measurements may still be displayed.

In some embodiments, data acquired by the low-speed sampling circuit can be displayed in a numerical format such as a seven segment decoder, or a graphical format such as a bar graph. The capture and display of this data can allow a user to take both traditional oscilloscope measurements (e.g., waveforms) and DVM measurements (e.g., direct current (DC) or RMS voltages) using a conventional oscilloscope probe without modification. These and other benefits of certain embodiments will be apparent from the description of specific embodiments below.

FIG. 1 is a diagram of a digital oscilloscope 100 according to a representative embodiment. In this embodiment, a single data acquisition pathway is used to capture and display a waveform. This embodiment can be contrasted with other embodiments in which multiple data acquisition pathways are used to capture and display oscilloscope data in different formats. In addition, this embodiment shows certain components that may be generally included in an oscilloscope processing block, although not specifically illustrated in other drawings for the sake of simplicity. Many of these components and their various alternatives are well understood by those skilled in the art and will therefore not be described in extensive detail.

Referring to FIG. 1, digital oscilloscope 100 comprises an attenuator 105, a vertical amplifier 110, an ADC 115, an acquisition memory 120, a display digital signal processor (DSP) 125, a display 130, a trigger system 135, a timebase system 140, and a controller 145. Attenuator 105 receives and attenuates an input signal from an input source such as an oscilloscope probe. The oscilloscope probe is typically connected to a DUT for test or measurement purposes. The input signal is transmitted through vertical amplifier 110, which adjusts it according to current settings of oscilloscope 100. Next, the input signal is sampled by ADC 115 to produce a stream of digital samples. The digital samples are then transmitted to acquisition memory 120 where they are stored for subsequent display by display 130.

Trigger and timebase systems 135 control the timing of data acquisition. Accordingly, they influence the waveform that is ultimately shown on display 130. The combination of trigger system 135, timebase system 140, and acquisition memory 120 can be referred to collectively as a data acquisition system. Once a waveform has been acquired by the data acquisition system, display DSP 125 controls display 130 to display the waveform data.

As indicated by various arrows in FIG. 1, controller 145 generates control signals or commands to control various operations performed by oscilloscope 100. For example, it may control attenuation, triggering, timebase management, and display of waveforms. Controller 145 may be configured according to inputs to user interface located near display 130 or on a separate apparatus.

Figure 2:
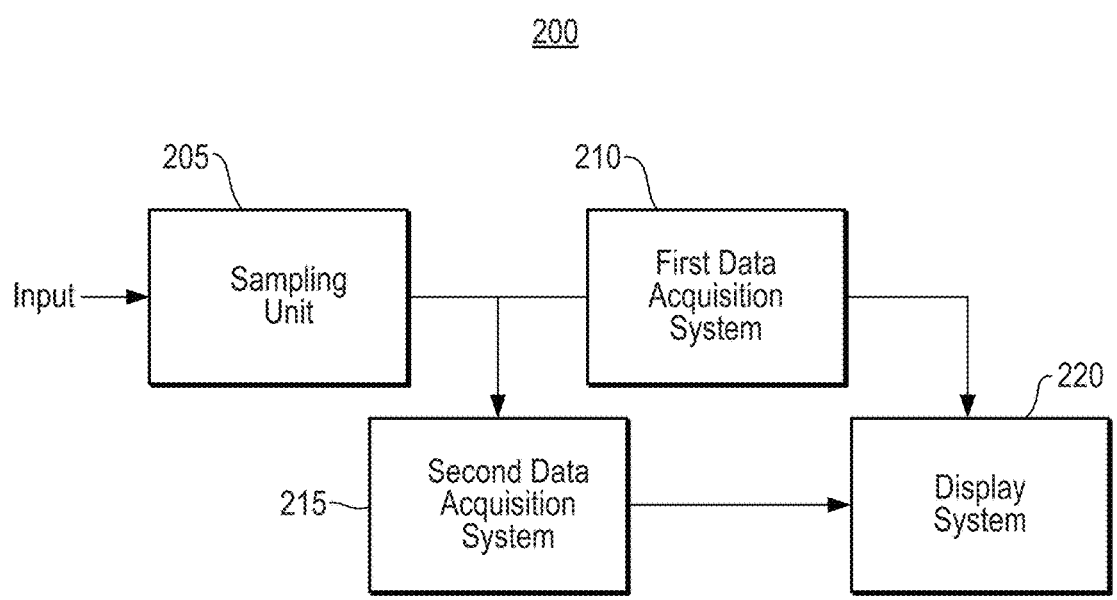
FIG. 2 is a diagram of a digital oscilloscope having multiple data acquisition pathways according to a representative embodiment.

FIG. 2 is a diagram of a digital oscilloscope 200 having multiple data acquisition pathways according to a representative embodiment. One of these pathways may comprise a data acquisition system for displaying waveform data, such as that illustrated in FIG. 1. Another one of these pathways may be a relatively low speed pathway that combines multiple samples produced by a sampling unit such as an ADC to facilitate low speed measurements such as DC levels and RMS values. The measurements can be combined in a variety of ways, such as averaging or summing of squares to produce RMS values. The use of this additional pathway may allow continuous access to high resolution tower sample rate digitized data from the ADC even if the other pathway is stopped or busy analyzing acquired data.

Referring to FIG. 2, digital oscilloscope 200 comprises a sampling unit 205, a first data acquisition system 210, a second data acquisition system 215, and a display system 220.

Sampling unit 205 is configured to sample an analog signal received from an oscilloscope probe to produce a first stream of digital samples. It may comprise, for instance, an ADC with a relatively high sampling rate for digitizing high frequency input signals.

First data acquisition system 210 is configured to store and process the first stream of digital samples to produce a first data set. In general, a data acquisition system, or acquisition system, can be any feature or set of features that acquires data for display on an oscilloscope. First data acquisition system 210 can comprise, for instance, an oscilloscope processing block such as that illustrated in FIG. 1. For example, it may comprise an acquisition memory, trigger and timebase controls, and so on. Accordingly, the first data set may comprise waveform data to be displayed as a triggered waveform.

Second data acquisition system 215 is configured to store and process the first stream of digital samples independent of the first data acquisition system to produce a second data set. Second data acquisition system 215 may comprise, for instance, another sampling unit that combines digital samples in the first stream by averaging them, computing their RMS values, or merely taking a representative subset of each group of samples. The average values may be computed, for instance, by summing multiple digital samples and dividing by the total number of summed samples, or by computing some other form of average such as a median, mode, or a weighted average. Depending on the way the digital samples are combined, second data acquisition system 215 may store different types of information.

For instance, to compute RMS values, second data acquisition system 215 may store a squared value of each digital sample among the first stream of digital samples and then generate the second data set by computing RMS values from the squared values.

Second data acquisition system 215 can be controlled in various ways to sample or otherwise processes the first stream of digital samples. For example, second data acquisition system 215 may perform sampling in response to asynchronous signals from a hardware based controller such as an FPGA or a software based controller such as a processor running a sampling or data processing routine. Such controllers can also be used, for instance, to perform averaging of samples or computations for generating RMS values.

Display system 220 is configured to concurrently display the first data set in a first format and the second data set in a second format different from the first format. Display system 220 may comprise, for instance, one or more display DSPs in combination with a rasterizer and other common display components. The first format can be, for instance, a waveform as described above. Meanwhile, the second format can be a numerical format such as a seven segment decoder as used more traditionally for DVM measurements. The first and second data sets may be displayed at the same time, for instance, by creating separate windows within a single oscilloscope display. Accordingly, a user may simultaneously view different types of information based on the same input signal.

Figure 3:
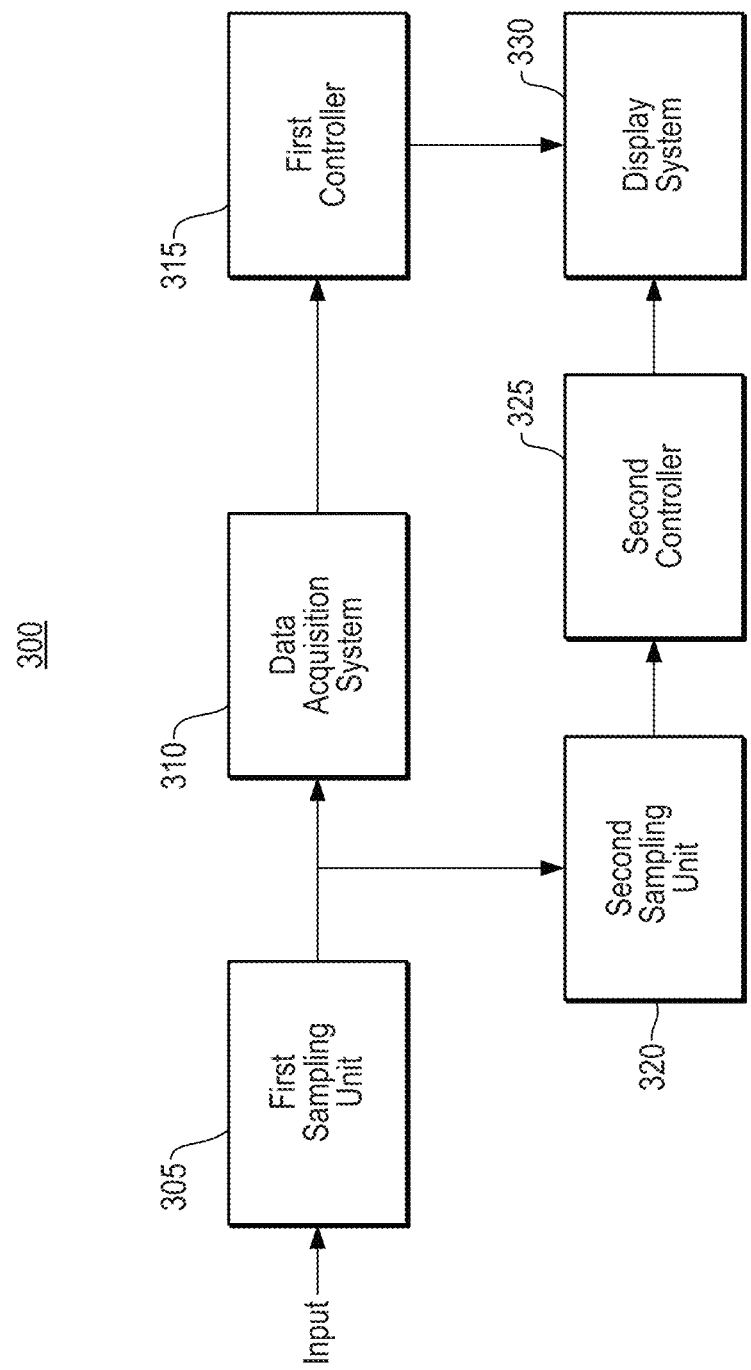
FIG. 3 is a diagram of a digital oscilloscope having multiple data acquisition pathways according to another representative embodiment.

FIG. 3 is a diagram of a digital oscilloscope 300 having multiple data acquisition pathways according to another representative embodiment. This embodiment can be viewed as a more specific example of the embodiment of FIG. 2 in which second data acquisition unit comprises a sampling unit.

Referring to FIG. 3, digital oscilloscope 300 comprises a first sampling unit 305, a data acquisition system 310, a first controller 315, a second sampling unit 320, a second controller 325, and a display system 330.

First sampling unit 305 is configured to sample an analog signal received from an oscilloscope probe to produce a first stream of digital samples. First sampling unit 305 can be implemented similar to sampling unit 205 of FIG. 2. Data acquisition system 310 is configured to store and process the first stream of digital samples to produce a first data set, and it can implemented similar to first data acquisition system 210 of FIG. 2.

Second sampling unit 320 is configured to downsample the first stream of digital samples to produce a second stream of digital samples. This downsampling can be accomplished, for instance, by combining groups of samples in the first stream to form the second stream. For instance, with an N:1 sampling ratio, second sampling unit 320 may combine N consecutive samples from the first data stream into one sample in the second stream. The combining of samples can be performed in a variety of ways, such as averaging, computing RMS values, and so on.

Display system 330 is configured to display the first stream of digital samples as a voltage waveform while concurrently displaying the second stream of digital samples in a numerical format. This can be performed as described in relation to FIG. 2, for example. Accordingly, the second stream of digital samples can be displayed in a numerical format such as seven segment decoder format while the first stream of digital samples is displayed as a waveform. Moreover, the seven segment decoder can be configured or formatted in a variety of ways for convenience or to provide additional information to the user. For instance, the seven segment decoder format can be color-coded according to an oscilloscope channel of the analog signal, or it can be enlarged so that it is viewable from a probe's length away.

First controller 315 is configured to control the display of the first stream of digital samples. For example, first controller may interact with an acquisition memory of data acquisition system 310 to retrieve a waveform in each update cycle and then transmit the retrieved waveform to a rasterizer or display buffer of display system 330.

Second controller 325 operates independent of first controller 315 and is configured to control the display of the second stream of digital samples. For example, second controller 325 may update a numerical display of the second stream of digital samples independent of updates to a waveform representing the first stream of digital samples.

In general, the samples acquired by second sampling unit 320 may be viewed as low frequency measurements compared with the first stream of digital samples. These low frequency measurements can be available for display on a continuous basis, even when data acquisition system 310 is stopped or a corresponding oscilloscope channel not displayed.

Figure 4:
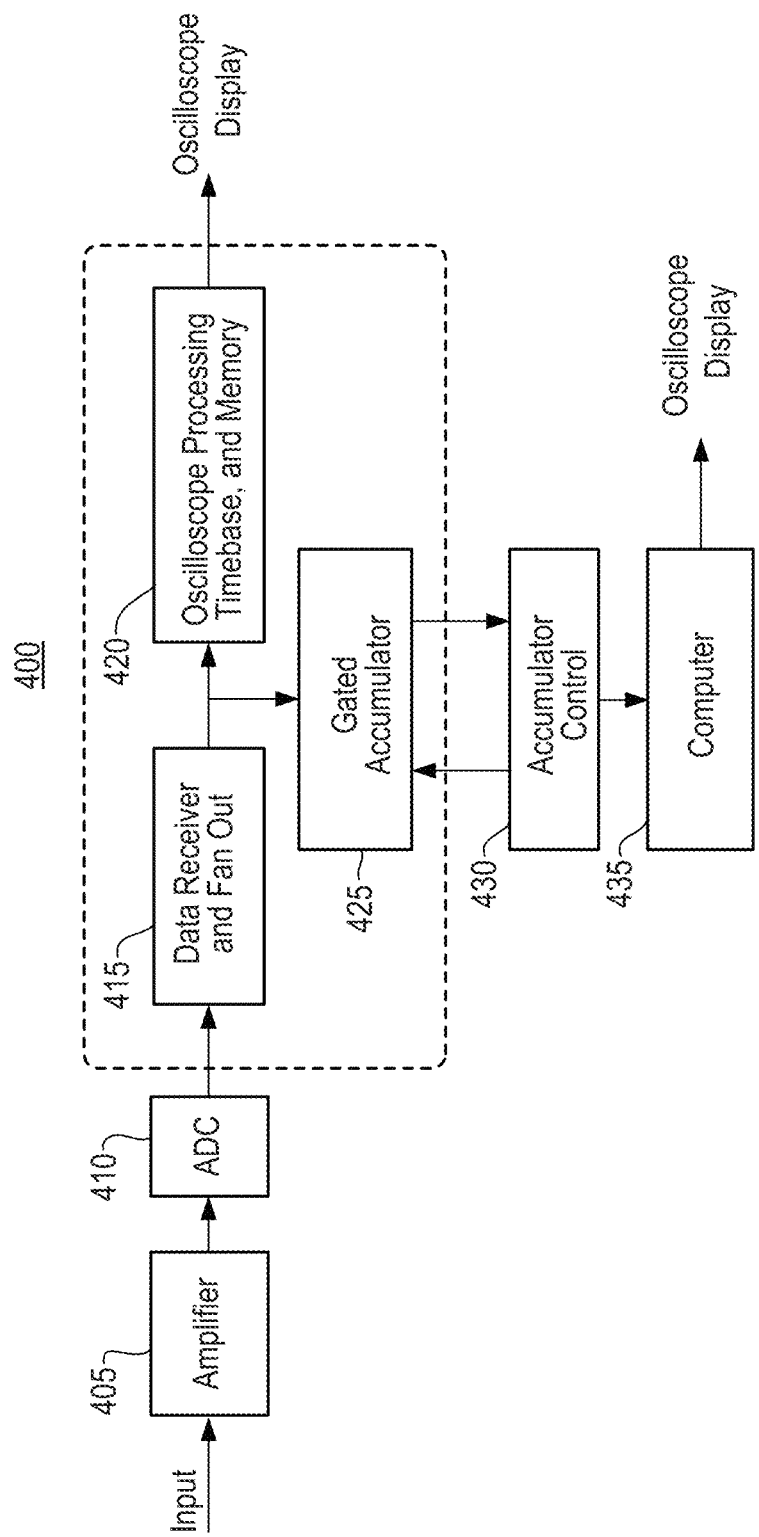
FIG. 4 is a diagram of a digital oscilloscope having multiple data acquisition pathways according to still another representative embodiment.

FIG. 4 is a diagram of a digital oscilloscope 400 having multiple data acquisition pathways according to still another representative embodiment. In this embodiment, one data acquisition pathway comprises an oscilloscope processing block such as that illustrated in FIG. 1, and another data acquisition pathway comprises a gated accumulator performs downsampling on a data stream generated by an ADC.

Referring to FIG. 4, digital oscilloscope 400 comprises an amplifier 405, an ADC 410, a data receiver 415, a data acquisition system 420, a gated accumulator 425, an accumulator controller 430, and a computer 435. Data acquisition system 420 can be viewed as a first data acquisition system such as that illustrated in FIG. 2, and gated accumulator 425 and related components may be viewed as a second data acquisition system such as that illustrated in FIG. 2. Accordingly, certain features described in relation to FIG. 2 and related embodiments may also apply to the embodiment of FIG. 4.

Amplifier 405 receives an analog input signal from an oscilloscope probe and transmits the signal to ADC 410. ADC 410 samples the analog input signal to generate a first stream of digital samples. Data receiver 415 receives and fans out the first stream of digital signals. The fallout typically slows down the data rate per communication path, but increases the number of paths. The total data rate is the same on either side of data receiver 415. One benefit provided by this arrangement is that it allows gated accumulator 425 to run at a slower dock rate, while using parallelism to avoid missing data.

Gated accumulator 425 is configured to receive the first stream of digital samples, accumulate a plurality of the digital samples during each of multiple successive intervals, and combine the samples accumulated in each interval to produce a second stream of digital samples having a lower sampling rate that the first stream of digital samples. For example, with an N:1 conversion rate, gated accumulator 425 may accumulate N samples during each interval and output a sum or average of the N samples. In some embodiments gated accumulator 425 combines the samples accumulated in each interval by determining their average, and in some other embodiments, it combines them by computing their RMS value.

In some embodiments, gated accumulator 425 combines accumulated samples in response to a control signal generated asynchronously by accumulator controller 430. For example, it may accumulate samples only when a gate enable signal is asserted and count the number of accumulated samples in order to compute their average. In such embodiments, the period where the gate enable signal is activated defines a sample aperture, or the time over which samples are accumulated. Accumulator controller 430 may adjust the timing or sampling resolution of gated accumulator 425 on a dynamic basis by adjusting this sample aperture. Such adjustments can be made, for instance, according to a user configured setting.

Data acquisition system 420 comprises an oscilloscope processing block similar to that illustrated in FIG. 1. For example, it may comprise a trigger system, a timebase system, and a memory for acquiring a waveform to be displayed by digital oscilloscope 400.

As indicated by a dotted box in FIG. 4, data acquisition system 420 and gated accumulator 425 can be formed on a single application specific integrated circuit (ASIC) separate from other components of digital oscilloscope 400. Moreover, in sonic embodiments, data acquisition system 420 and gated accumulator 425 are formed on a first chip while accumulator controller 430 is formed on a second chip. For instance, the first chip can comprise an ASIC while the second chip comprises an FPGA. In some embodiments, the FPGA controls the gate enabled signal of gated accumulator 425 and then reads and stores the accumulator sums along with a sample counter value in a circular buffer within the FPGA. Alternatively, these functions could be performed by software instead of an FPGA. Yet another alternative is to implement accumulator controller 430 in an ASIC along with gated accumulator 425.

Computer 435 reads sums and sample counts obtained by accumulator controller 430 (e.g., the FPGA). Based on the sums and sample counts, computer 435 determines average values of digital samples accumulated for each sample aperture. By averaging, the resolution of digital samples may be increased, for instance, by about one bit for each factor of 4 of the sample count. Moreover, computer 435 can calculate not only average values, but RMS values or other quantities related to the sampled signal. For RMS values or other measurements, it may be necessary for gated accumulator 425, accumulator controller 430 or computer 435 to compute additional intermediate values, such as the squares of input digital samples for RMS values. The bandwidth of the measurements is determined generally by the sample aperture and the sampling frequency of ADC 410.

Figure 5:
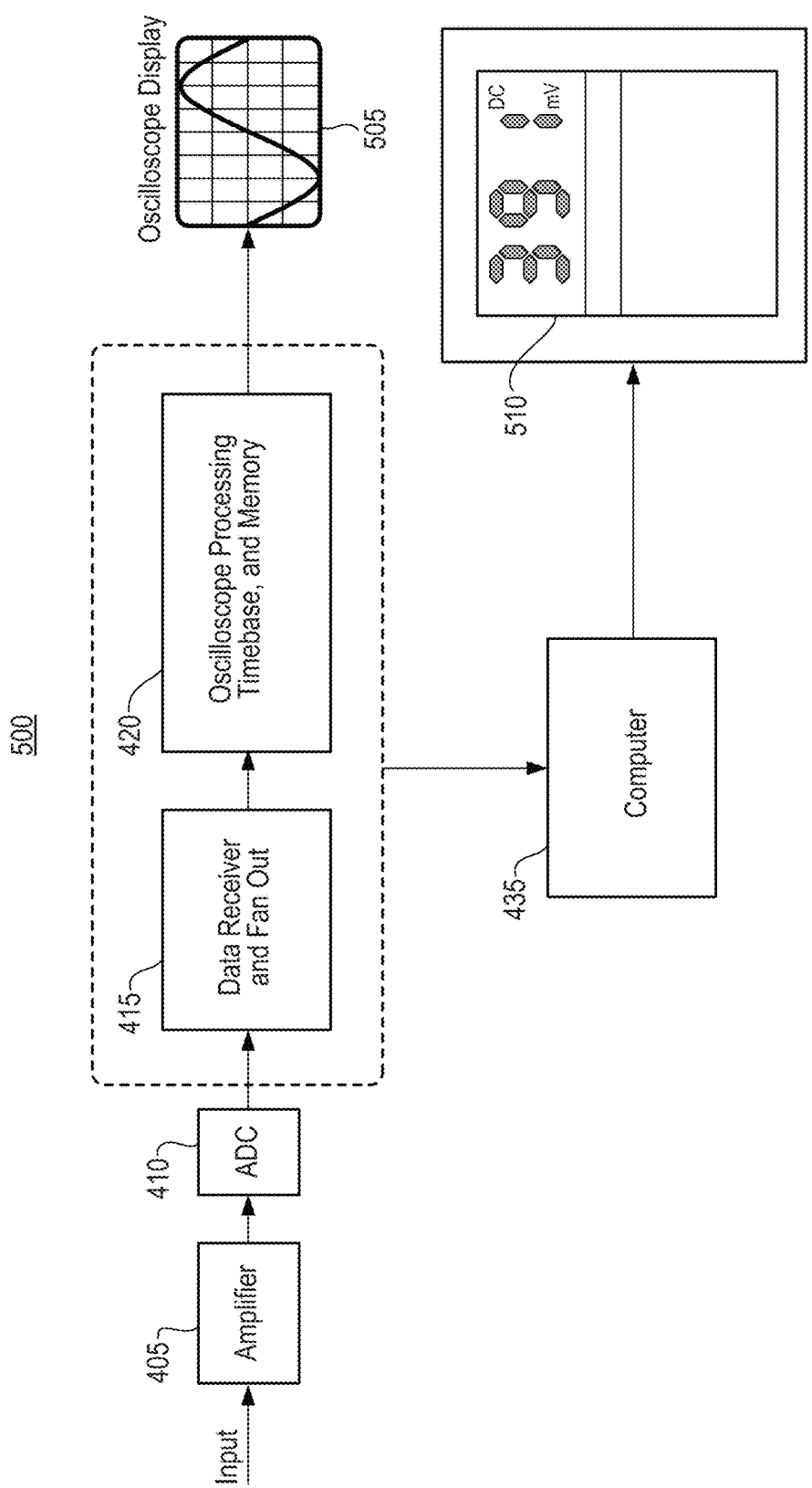
FIG. 5 is a diagram of a digital oscilloscope having multiple data acquisition pathways according to still another representative embodiment.

FIG. 5 is a diagram of a digital oscilloscope 500 having multiple data acquisition pathways according to still another representative embodiment. In FIG. 5, two parts of an oscilloscope display are shown with two different forms of data produced from the same stream of digital samples. These different displays may be particularly useful, for instance, where a user desires to observe both the waveform shape and DVM measurements of a DUT. In a conventional context, a user may be required to use both an oscilloscope and a DVM to observe both of these DUT properties during an interactive test or debugging session. In addition, the user in the conventional context may be required to use two sets of probes, two user interfaces, two readout screens, two control input devices, and two input control methods.

In conventional oscilloscopes, measurements similar to these DVM measurements may be made with traditional triggered acquisition data in memory. However, if a user is examining low frequency signals, the user must configure the oscilloscope scope to acquire several cycles in order to measure accurately. This may produce a measurement update rate many times slower than a signal of interested when the acquisition and processing latency is included and this latency affects over all user efficiency in evaluating a DUT. This latency can render the usefulness of these measurements to be very low and significantly slow down DUT testing and measurement. Additionally, no DVM like measurement may be made until the oscilloscope is configured to trigger in the setup of interest and the signals present the appropriate attributes to the trigger system. This could lead to not being able to make this measurement at all.

Referring to FIG. 5, digital oscilloscope 500 comprises some of the same features as digital oscilloscope 400. In particular, it comprises amplifier 405, ADC 410, data receiver 415, data acquisition system 420, and computer 435. These features operate in substantially the same way as in digital oscilloscope 400, with the exception that computer 435 receives and processes data that may or may not have passed through a gated accumulator. The first stream of digital samples can be transferred from data receiver 415 to computer 435 using any of various available data transfer protocols or mechanisms. Computer 435 can then process the digital samples to produce measurements such as average values, RMS values, and so on. Moreover, although not shown, there may be intermediate components between data receiver 415 and computer 435, such as substitutes or alternatives to gated accumulator 425.

As illustrated in FIG. 5, a first stream of digital samples processed by data acquisition system 420 is displayed on an oscilloscope display as a waveform 505, and a second stream of digital samples processed by computer 435, e.g., a low-speed data stream, is displayed on the oscilloscope display in a seven segment format 510. In the example of FIG. 5, the seven segment display shows a DC value of the input signal in millivolts.

In some embodiments, the seven segment format 510 may have a relatively large size to allow viewing from a distance, such as a probe's length away. This can allow a user to view the displayed numerical value while probing a DUT at a distance. The seven segment display format also has the benefit of appearing similar to the displays of many DVMs. In other words, because users may be accustomed to reading DVM measurements in a seven segment format, it can be useful to display DVM measurements in this format on an oscilloscope display. It should be noted that the seven segment format does not require a traditional seven segment display, such as those formed by custom liquid crystal displays (LCDs). Rather, the seven segment format can be used to simulate the appearance of a seven segment display in another graphical display interface or any other suitable technology for displaying data.

Figure 6A:
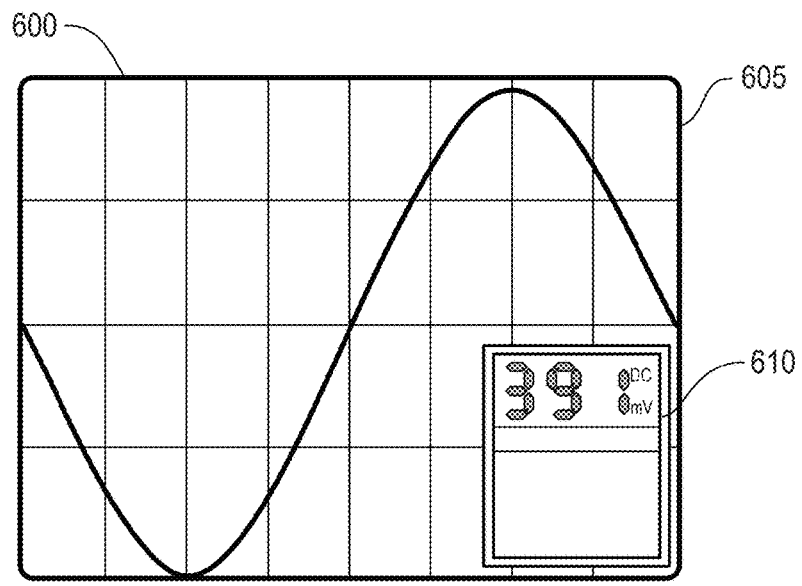
FIGS. 6A and 6B are diagrams of various display configurations for an oscilloscope display showing data in different formats according to representative embodiments.
Figure 6B:
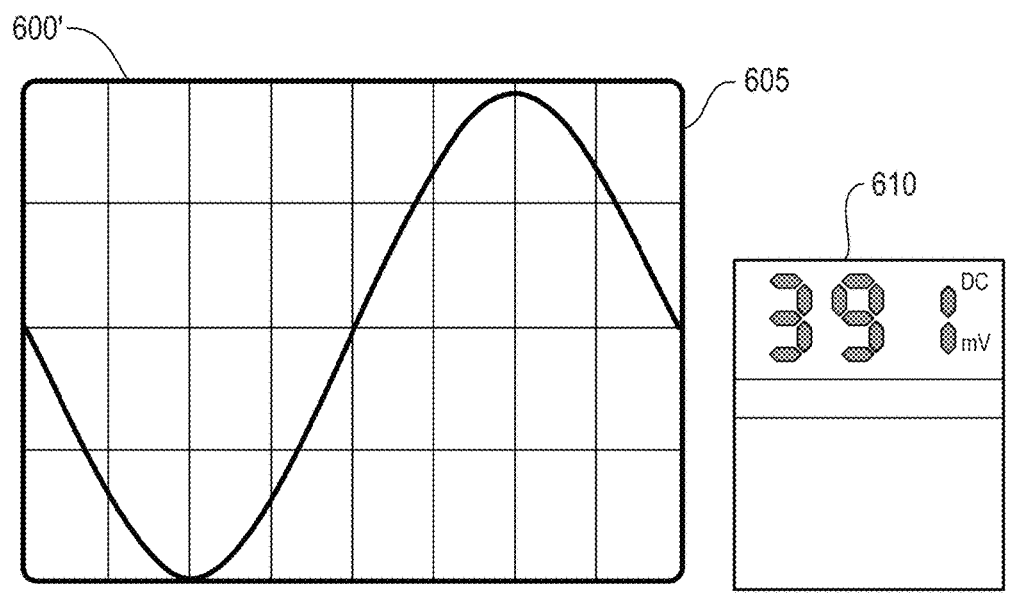

FIGS. 6A and 6B are diagrams of various display configurations for an oscilloscope display configured to show data in different formats according to representative embodiments. The examples of FIGS. 6A and 6B can be used, for instance to concurrently display the waveform and numerical data in the embodiment of FIG. 5.

Referring to FIG. 6A, in a first display configuration 600, a first display window 605 shows a waveform of digital samples acquired through a first data acquisition pathway, and a second display window 610 shows a numerical display of data generated through a second data acquisition pathway from the same set of digital samples used to generate the waveform. In the first display configuration 600, second display window 610 is embedded in first display window 605, which may obscure part of the displayed waveform, but may be convenient for simultaneous viewing of both display windows.

Referring to FIG. 6B, in a second display configuration 600', first display window 605 and second display window 610 are arranged side by side. This allows for full viewing of both display windows, but it is larger than the first display configuration 600.

Figure 7A:
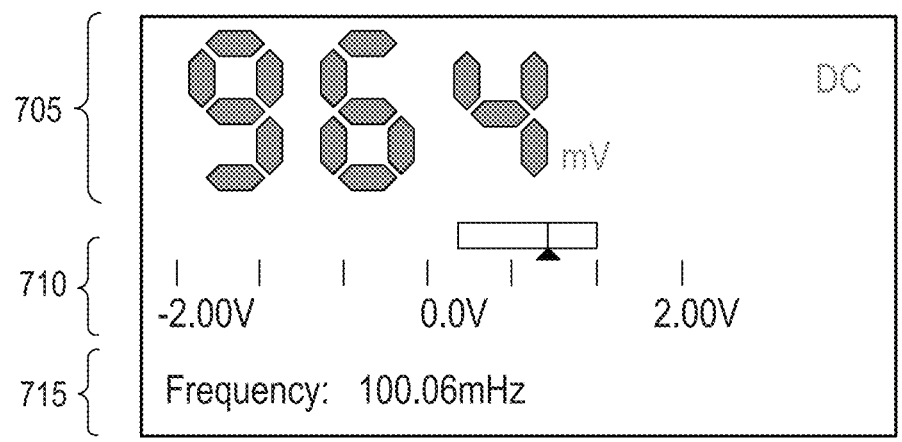
FIGS. 7A and 7B are diagrams illustrating portions of an oscilloscope display comprising a bar graph according to a representative embodiment.
Figure 7B:
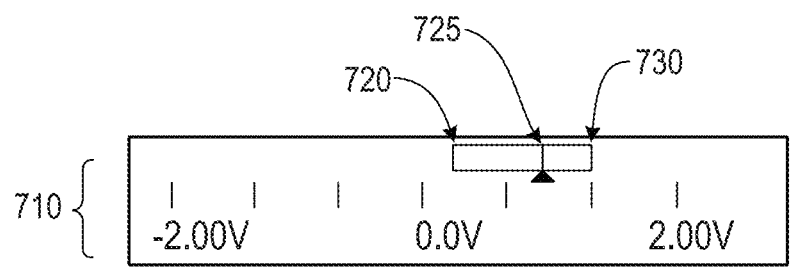

FIGS. 7A and 7B are diagrams illustrating portions of an oscilloscope display comprising a bar graph according to a representative embodiment. The bar graph can be included, for instance, in a secondary display window such as that illustrated in FIGS. 6A and 6B.

Referring to FIG. 7A, a display window 700 comprises a first portion 705, a second portion 710, and a third portion 715. First portion 705 shows a DC voltage measurement obtained through a secondary data acquisition pathway, measured in millivolts. Second portion 710 shows a bar graph on a scale from −2.0 volts to +2.0 volts. Third portion shows a frequency of a signal being measured.

The bar graph in second portion 710 indicates minimum, maximum, and current voltages of a measured signal over a predetermined window of time, such as the last 3 seconds. The window can be automatically updated so that it maintains a running average without requiring a user input for a reset. This type of display can be useful where a user wants a quick view of how much a value is changing over a last short period of time, and the user also needs the measurement to be adjusted as a probe is moved around.

Referring to FIG. 7B, the bar graph in second portion 710 is a horizontal bar graph having a left side 720 indicating a minimum voltage that has been measured during the window of time, a right side 730 indicating a maximum voltage during the window of time, and a line 725 indicating a current, i.e., real-time voltage measurement. The width of the bar graph provides an indication of the signal's range of variation during the window of time, which can indicate various electrical effects such as drift of a DC signal, or the maximum amplitude swing of an AC signal, for example.

As indicated above, the bar graph is adjusted automatically to maintain a moving average, so it does not need to be reset as a user moves an oscilloscope probe between different test points on a DUT. In addition, it provides a real-time voltage value within the bar graph, which can be readily compared with the minimum and maximum values. Moreover, the bar graph could also include an indication of an average value over the window of time.

Figure 8A:
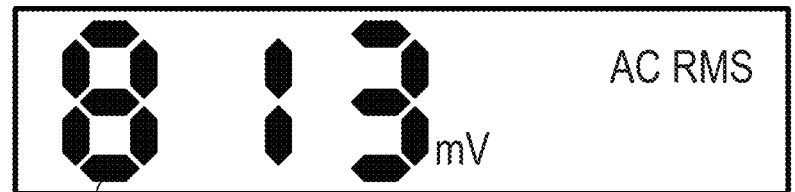
FIGS. 8A and 8B are diagrams illustrating a color-coded display of data from different oscilloscope channels according to a representative embodiment.
Figure 8B:
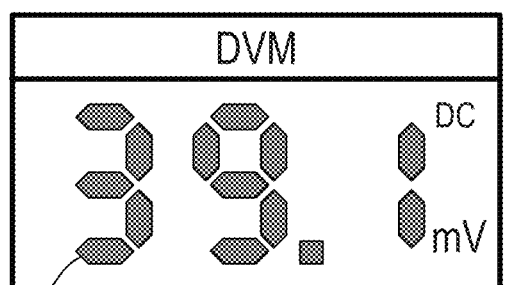

FIGS. 8A and 8B are diagrams illustrating a color-coded display of data from different oscilloscope channels according to a representative embodiment. The measurements shown in FIGS. 8A and 8B are typically obtained through a secondary data acquisition pathway, similar to numerical measurements illustrated FIGS. 5-7, for example.

FIG. 8A shows an AC RMS value of a signal being measured through a first channel. This measurement is coded with a first color "Color 1" to indicate that it was obtained through the first channel. FIG. 8B shows a DC voltage of a signal measured through a second channel. This measurement is coded with a second color "Color 2" to indicate that it was obtained through the second channel. The color coding of these measurements may allow a user to clearly identify which probe tip is being used to generate the values, even at a distance such as a probes length away from the display. Accordingly, the color coding can be beneficial for users interested in observing many characteristics of a DUT at the same time.

As with the display windows shown in FIG. 6, the display windows of FIGS. 7 and 8 can be arranged in a variety of alternative configurations. For example, these windows may be overlapped on a waveform grid, they may be displayed in a sidebar of a graphical interface, or they may be displayed in a separate screen from waveform displays.

The numerical values illustrated FIGS. 7 and 8, including the values forming the bar graph, can be determined by a controller or computer such as those illustrated in secondary data acquisition pathways of FIGS. 2 through 5. For example, a controller such as an FPGA can be used to determine minimum and maximum values of a second stream of digital samples over a rolling window of time, and to then transmit the determined values to a display system configured to present the bar graph indicating the minimum and maximum values.

As indicated by the foregoing, the use of multiple data acquisition pathways in a digital oscilloscope may allow a user to simultaneously acquire and view multiple types of measurements without the use of additional oscilloscope probes and without substantially improving the complexity of the digital oscilloscope. In addition, the display of both oscilloscope measurements and DVM measurements in a single oscilloscope can be particularly useful for engineers accustomed to characterizing a single DUT with these two different types of measurements. Further, the use of large seven segment displays, bar graphs, and color coordinated measurements can make it easier for a user to assimilate various forms of information simultaneously or in combination.

In certain embodiments, a secondary data acquisition pathway can be readily implemented in the context of existing oscilloscope hardware, such as ASIC and an FPGA, allowing a cost efficient design. In addition, the secondary data acquisition pathway can potentially be implemented with a relatively small amount of circuitry, which also contributes to cost efficiency. Moreover, secondary acquisition pathways such as those illustrated in FIGS. 2-5 do not require changes to the analog design of an oscilloscope which also minimizes added cost and complexity.

A secondary data acquisition pathway can generally be implemented with any analog scope channel input. Accordingly, it does not typically require double probing or special probes. In addition, this pathway may also have access to full bandwidth sampled oscilloscope data from a high performance oscilloscope ADC, which may allow higher sample rate data and higher bandwidth measurements compared with approaches using a separate ADC or separate input. Additionally, the amplitude resolution of the measurements can be increased beyond the resolution of the ADC by averaging the ADC samples.

In general, the described embodiments are not limited to a particular class of oscilloscopes. For example, they may use bench class oscilloscope. Moreover, they are not limited to multi-probe oscilloscopes and can be used with single probe oscilloscopes, for example. The described embodiments also are not limited to specific data acquisition techniques, such as triggered data capture, and therefore they may achieve comparatively fast measurement response times.

Additionally, the described embodiments are not limited to a single channel in a multiple channel oscilloscope. Rather, an oscilloscope in certain embodiments may include multiple acquisition pathways operating concurrently to generate supplemental measurements for each of multiple channels. These supplemental measurements can include, e.g., a DVM measurement for each channel. Each of the different acquisition pathways can include, for instance, an independent control unit, sampler, or accumulator, and as various embodiments described above. In addition, the additional DVM measurements could be displayed simultaneously in multiple seven segment displays of the oscilloscope. For example, in FIG. 6B, second display window 610 could be augmented to include multiple seven segmented display readouts stacked on the right side of first display window 605. The use of multiple secondary acquisition paths can further reduce the number of probes sets needed generate multiple DVM or oscilloscope measurements while allowing all data to be displayed clearly in a single user display.

While representative embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A system, comprising:
   a sampling unit configured to sample an input signal received from an oscilloscope probe to produce a first stream of digital samples;
   a first acquisition system configured to store and process the first stream of digital samples to produce a first data set;
   a second acquisition system configured to store and process the first stream of digital samples independent of the first acquisition system to produce a second data set; and
   a display system configured to concurrently display the first data set in a first format and the second data set in a second format different from the first format, the first data set and the second data set not being stored by a memory external to the first and second acquisition systems, respectively.

2. The system of claim 1, wherein the second acquisition system combines digital samples among the first stream of digital samples to produce a second stream of digital samples having a lower sampling rate than the first stream of digital samples.

3. The system of claim 2, wherein the second acquisition system comprises an accumulator configured to receive the first stream of digital samples, accumulate a plurality of the digital samples during each of multiple successive intervals, and combine the samples accumulated in each interval to produce the second stream of digital samples.

4. The system of claim 1, wherein the second acquisition system stores a squared value of each digital sample among the first stream of digital samples.

5. The system of claim 4, wherein the second acquisition system generates the second data set by computing root mean squared (RMS) values from the squared values.

6. The system of claim 1, wherein the first format comprises a triggered waveform, and the second format comprises a numerical format.

7. The system of claim 6, wherein the numerical format is a seven segment display format.

8. The system of claim 1, further comprising a first controller configured to control the display of the first data set, and a second controller configured to control the display of the second data set independent of the first controller.

9. The system of claim 1, wherein the first and second acquisition systems are formed on a single application specific integrated circuit (ASIC).

10. The system of claim 3, wherein the accumulator combines the samples accumulated in each interval by determining their average.

11. The system of claim 3, wherein the accumulator is configured to combine the samples accumulated in each interval in response to a control signal generated asynchronously by a controller.

12. The system of claim 11, wherein the first acquisition system and the accumulator are formed on a first chip and the controller is formed on a second chip.

13. The system of claim 12, wherein the first chip comprises an application specific integrated circuit (ASIC) and the second chip comprises a field programmable gate array (FPGA).

14. The system of claim 1, wherein the sampling unit comprises an analog to digital converter (ADC).

15. The system of claim 1, wherein the first acquisition system comprises a memory, a trigger system, and a timebase system.

16. The system of claim 1, wherein the second acquisition system comprises a controller storing software for processing the first stream of digital samples to produce a second data set.

17. A system, comprising:
   a first sampling unit configured to sample an input signal received from an oscilloscope probe to produce a first stream of digital samples;
   an acquisition system configured to store and process the first stream of digital samples;
   a second sampling unit configured to downsample the first stream of digital samples to produce a second stream of digital samples; and
   a display system configured to display the first stream of digital samples as a voltage waveform and concurrently display the second stream of digital samples in a numerical format, the first stream of digital samples, and the second stream of digital samples not being stored by a memory external to the acquisition system.

18. The system of claim 17, wherein the numerical format is a seven segment decoder format.

19. The system of claim 18, wherein the seven segment decoder format is color-coded according to an oscilloscope channel of the input signal.

20. The system of claim 17, further comprising a first controller configured to control the display of the first stream of digital samples, and a second controller operating independent of the first controller and configured to control the display of the second stream of digital samples.

21. The system of claim 17, further comprising multiple acquisition pathways operating concurrently to generate a numerical measurement for each of multiple oscilloscope channels, wherein the display is configured to concurrently display the numerical measurements.

22. A system, comprising:
   a first sampling unit configured to sample an input signal received from an oscilloscope probe to produce a first stream of digital samples;
   an acquisition system configured to store and process the first stream of digital samples;
   a second sampling unit configured to downsample the first stream of digital samples to produce a second stream of digital samples;
   a controller configured to determine minimum and maximum values of the second stream of digital samples over a window of time; and
   a display system configured to present a bar graph indicating the minimum and maximum values, the first stream of digital samples, and the second stream of digital samples not being stored by a memory external to the acquisition system.

23. The system of claim 22, wherein the controller is further configured to determine an average value of a voltage over the window of time and the display system is further configured to present the average value on the bar graph.

24. The system of claim 22, wherein the controller is further configured to determine a current value of a voltage, and the display system is further configured to present the current value on the bar graph.

25. The system of claim 22, wherein the bar graph is a horizontal bar graph comprising a left side indicating the minimum value and a right side indicating the maximum value.

\* \* \* \* \*